US005675157A

United States Patent [19]

Battersby

[11] Patent Number: 5,675,157
[45] Date of Patent: Oct. 7, 1997

[54] TRANSFERRED ELECTRON EFFECT DEVICE

[75] Inventor: Stephen J. Battersby, Haywards Heath, England

[73] Assignee: U.S. Philips Corporation, New York, N.Y.

[21] Appl. No.: 501,893

[22] Filed: Jul. 13, 1995

[30]  Foreign Application Priority Data

Jul. 15, 1994 [GB] United Kingdom ............... 9414311

[51] Int. Cl.$^6$ ............................. H01L 27/26; H01L 47/00
[52] U.S. Cl. ........................... 257/6; 257/11; 257/26; 257/495; 257/625
[58] Field of Search ..................... 257/6, 11, 26, 257/498, 625

[56]  References Cited

U.S. PATENT DOCUMENTS

| | | | |
|---|---|---|---|
| 3,673,469 | 6/1972 | Colliver et al. | 317/234 |
| 3,753,804 | 8/1973 | Tijburg et al. | 148/177 |
| 3,755,752 | 8/1973 | Kim | 330/34 |
| 4,238,763 | 12/1980 | Gray et al. | 357/68 |
| 4,649,405 | 3/1987 | Eastman | 257/6 |
| 5,250,815 | 10/1993 | Battersby et al. | 257/6 |
| 5,258,624 | 11/1993 | Battersby et al. | 257/11 |

FOREIGN PATENT DOCUMENTS

| | | | |
|---|---|---|---|
| 5477064 | 6/1979 | Japan | 257/6 |
| 7038175 | 2/1995 | Japan | 257/6 |

*Primary Examiner*—Donald Monin
*Attorney, Agent, or Firm*—Steven R. Biren

[57]  ABSTRACT

A semiconductor body (2) has an active region (6) of n conductivity type formed of a material having a relatively low mass, high mobility conduction band main minimum and at least one relatively high mass, low mobility conduction band satellite minimum and an injector region (9) defining a potential barrier (P) to the flow of electrons into the active region (6) of a height such that, in operation of the device, electrons with sufficient energy to surmount the barrier (P) provided by the injector region (9) are emitted into the active region (6) with an energy comparable to that of the at least one relatively high mass, low mobility conduction band satellite minimum. An electron containing well region (10a, 10b) of a material different from that of the active region (6) and of the injector region (9) is provided between the injector region (9) and the active region (6) for inhibiting the spread of a depletion region into the active region (6) during operation of the device.

19 Claims, 4 Drawing Sheets

TRANSFERRED ELECTRON EFFECT DEVICE

BACKGROUND OF THE INVENTION

This invention relates to a transferred electron effect device.

U.S. Pat. No. 4,801,982 describes a transferred electron effect device comprising a semiconductor body having an active region of n conductivity type formed of a material having a relatively low mass, high mobility conduction band main minimum and at least one relatively high mass, low mobility conduction band satellite minimum and an injector region defining a potential barrier to the flow of electrons into the active region of a height such that, in operation of the device, electrons with sufficient energy to surmount the barrier provided by the injector region are emitted into the active region with an energy comparable to that of the at least one relatively high mass, low mobility conduction band satellite minimum.

In the absence of the injector region, a significant proportion of the active region would be occupied by the so-called acceleration or dead zone, that is the space within the active region required for the electrons to gain sufficient energy to transfer to a conduction band satellite minimum to cause the active region to exhibit the bulk negative differential resistance which is required to allow charge instabilities to grow to form the accumulation or dipole layers necessary for the device to function as a transferred electron effect device such as a Gunn diode. For further details of the transferred electron effect, reference may be made to any suitable text book, for example, Chapter 11 of "Physics of Semiconductor Devices", Second Edition, by S.M. Sze published in 1981 by John Wiley & Sons, Inc. of New York.

The injector region is intended to enable electrons with an energy comparable to that of a conduction band satellite minimum to be injected into the active region, so avoiding, or at least reducing the extent of, any acceleration or dead zone within the active region. This reduction of the acceleration or dead zone should result in an improvement in the rf (radio frequency) output power and efficiency of the transferred electron effect device.

The transferred electron effect device described in U.S. Pat. No. 4,801,982 has an active region which may be formed from gallium arsenide or indium phosphide and the injector region is in the form of a graded band gap injector region comprising a varying composition of aluminium gallium arsenide or indium aluminium arsenide. The graded band gap injector region is intended to allow an improvement in the power and efficiency of the transferred electron device by allowing the accumulation or dipole layer to start as close as possible to the cathode region. A relatively highly doped region separates the injector region from the active region to inhibit the spread of the depletion region into the relatively lowly doped active region.

The present inventor has however found that the inclusion of this highly doped region tends to cause band bending which pulls the conduction band in the active region down adjacent the injector region and so causes the energy with which electrons are emitted into the active region to fall so that a or a larger acceleration zone will be required within the active region for the electrons to gain sufficient energy to transfer to a conduction band satellite minimum. The inclusion of this highly doped region thus detrimentally affects the performance and efficiency of the device.

SUMMARY OF THE INVENTION

It is an aim of the present invention to provide a transferred electron effect device in which the spread of a depletion region into the active region can be inhibited without significantly reducing the energy with which electrons are emitted into the active region.

In a first aspect, the present invention provides a transferred electron effect device comprising a semiconductor body having an active region of n conductivity type formed of a material having a relatively low mass, high mobility conduction band main minimum and at least one relatively high mass, low mobility conduction band satellite minimum and an injector region defining a potential barrier to the flow of electrons into the active region of a height such that, in operation of the device, electrons with sufficient energy to surmount the barrier provided by the injector region are emitted into the active region with an energy comparable to that of the at least one relatively high mass, low mobility conduction band satellite minimum, characterised in that an electron-containing well region of a material different from that of the active region and of the injector region is provided between the injector region and the active region for inhibiting the spread of a depletion region into the active region during operation of the device.

The inclusion of such a well region inhibits the spread of the depletion region into the active region during operation of the device without the significant conduction band bending which might otherwise arise. Thus, the use of a well region to inhibit the spread of the depletion region enables the difference in conduction band energies between the injector region and the active region to be maintained so enabling electrons to be injected into the active region with high energy which, as noted above, should facilitate improved performance.

The injector region may be any suitable injector region, for example an injector region of the type described and claimed in our U.S. Pat. No. 5,258,624 or a graded band gap injector region of the type mentioned above. Where a graded band gap injector region is used and the active region comprises indium phosphide, then the graded band gap injector region may comprise gallium aluminium indium phosphide, for example, $Ga_{0.48x}Al_{0.48(1-x)}In_{0.52}As$, where x decreases from 1 to 0 in a direction away from the cathode region.

In one example, the well region may be formed of n conductivity type semiconductor material. The well region may comprise n conductivity gallium indium arsenide where the active region comprises indium phosphide.

In another example, the well region may be modulation-doped by a relatively highly doped semiconductor modulation region doped so as to be n conductivity type and spacing the well region from the active region.

The use of a modulation-doped well region has additional advantages in that the doping of the modulation region is independent of the width of the well. This enables the doping level in the modulation region to be lower than that used where the well itself is doped because the modulation region can be thinner than the well region. Accordingly, the Fermi level can be much lower, thereby enabling the energy at which electrons are emitted over the potential barrier defined by the injector region to be increased, so making it even more likely that electrons emitted over the barrier provided by the graded band gap injector will be transferred directly to a satellite conduction band minimum. This should result in a transferred electron effect device having an even better rf output power and efficiency.

Moreover, because the dopant is located in the modulation region, the fact that the Fermi level is low in the well region does not necessarily lead to depletion of the active region.

The modulation region may be spaced from the well region by an intrinsic spacer region formed of the same semiconductor as the modulation region. The well region may comprise gallium indium arsenide and the modulation region may comprise indium phosphide.

According to a second aspect of the present invention, there is provided a semiconductor device having a semiconductor body comprising an indium phosphide region doped so as to be of one conductivity type and an electrically conductive electrode forming electrical contact with the indium phosphide region, characterised in that an gallium indium arsenide region of the one conductivity type is provided between the indium phosphide region and the electrically conductive electrode to provide an ohmic contact between the electrode and the indium phosphide region.

According to a third aspect of the present invention, there is provided a transferred electron effect device comprising a semiconductor body having an active region comprising indium phosphide doped so as to be n conductivity type, anode and cathode semiconductor regions spaced apart by the active region and each comprising semiconductor regions highly doped so as to be n conductivity type and anode and cathode electrodes contacting the anode and cathode regions, respectively, characterised in that the anode and cathode regions comprise highly n conductivity type gallium indium arsenide regions forming ohmic contacts with the anode and cathode electrodes, respectively.

A heat sink region may be provided on an exposed surface of the anode region for removing heat dissipated in the device. As described and claimed in our U.S. Pat. No. 5,250,815, this should result in a further improvement performance.

BRIEF DESCRIPTION OF THE DRAWING

Embodiments of the present invention will now be described, by way of example, with reference to the accompanying drawing, in which.

It should of course be understood that the drawings are not to scale and that like reference numerals are used throughout text to refer to like parts.

DESCRIPTION OF THE PREFERRED EMBODIMENTS

Figure 1:
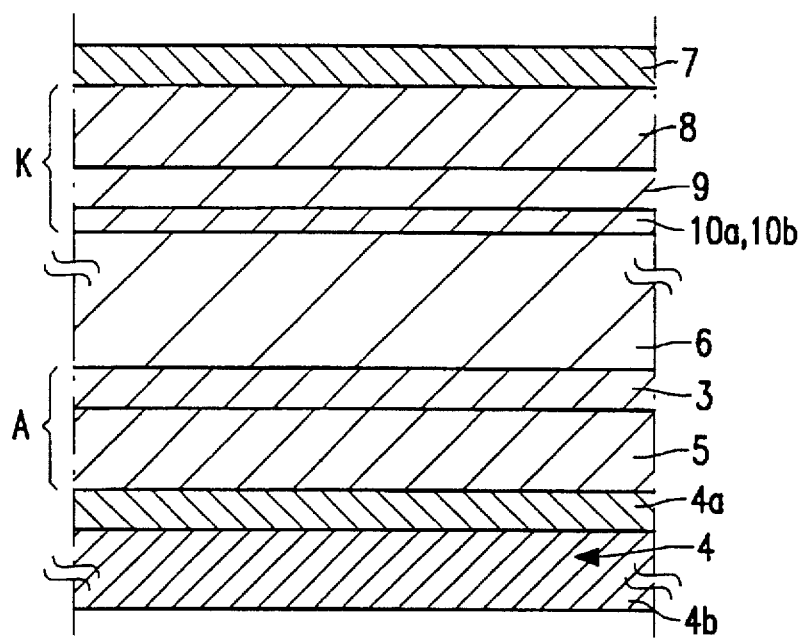
FIG. 1 shows a schematic cross-sectional view through part of a transferred electron effect device in accordance with the invention.

Referring now to the drawings, FIGS. 1 to 5 illustrate examples of transferred electron effect devices 1 each comprising a semiconductor body 2 having an active region 6 of n conductivity type formed of a material having a relatively low mass, high mobility conduction band main minimum and at least one relatively high mass, low mobility conduction band satellite minimum and an injector region 9 defining a potential barrier P to the flow of electrons into the active region 6 of a height such that, in operation of the device, electrons with sufficient energy to surmount the barrier P provided by the injector region 9 are emitted into the active region 6 with an energy comparable to that of the at least one relatively high mass, low mobility conduction band satellite minimum.

In accordance with the invention, an electron-containing well region 10a, 10b of a material different from that of the active region 6 and of the injector region 9 is provided between the injector region 9 and the active region 6 for inhibiting the spread of a depletion region into the active region 6 during operation of the device.

As will be appreciated by those skilled in the art, a well region, more commonly a quantum well region, for electrons is a region of one material which is sandwiched between barrier regions of different material that have a conduction band energy greater than that of the one material so that electrons are trapped in confined states within the well region and which is sufficiently thin that the confined state energy levels within the well region are quantised. Generally, although not necessarily, a well region for electrons will also form a well region for holes and will thus have a valence band energy lower (ie of higher hole energy) than that of the barrier regions.

The term "electron-containing well region" as used herein should be understood to mean a well region which is either directly doped so as to be of n conductivity type or is modulation-doped from an n conductivity type modulation layer or is otherwise caused to contain electrons.

The well region 10a, 10b should be sufficiently thin to allow the passage of hot charge carriers, that is charge carriers with an energy above the Fermi level of the active region 6, to pass without significant cooling or thermalisation yet sufficiently thick that the lowest confined state energy level is not significantly raised above the minimum energy point within the well region 10a.

The inclusion of such an electron-containing well region 10a, 10b inhibits the spread of the depletion region into the active region 6 during operation of the device without the significant conduction band bending which might otherwise arise if a depletion region stop in the form of a highly doped region of the same material as the active region were used. The difference in conduction band energies between the injector region 9 and the active region 6 is thus maintained so enabling electrons to be injected into the active region 6 with an energy comparable to that of a conduction band satellite minimum. Thus, the need for any dead space or acceleration zone in the active region 6 is removed or at least reduced which should facilitate improved performance.

Referring now to FIG. 1, there is shown a transferred electron effect device 1 having a semiconductor body 2 comprising an active region 6 comprising indium phosphide doped so as to be n conductivity type, anode and cathode semiconductor regions A and K spaced apart by the active region 6 and each comprising semiconductor regions highly doped so as to be n conductivity type and anode and cathode electrodes 4 and 7 contacting the anode and cathode regions A and K. In this example, the anode and cathode regions A and K comprise highly n conductivity type gallium indium arsenide regions 5 and 8 forming ohmic contacts with the anode and cathode electrodes 4 and 7, respectively.

In the example shown in FIG. 1, the injector region is in the form of a graded band gap injector region 9 and forms part of the cathode region K. The graded band gap injector region 9 is formed of a suitable III–V semiconductor compound which separates the active region 6 from the gallium indium arsenide contact region 8. In this example, the semiconductor material is gallium aluminium indium arsenide with the composition: $GA_{0.48x}Al_{0.48(1-x)}In_{0.52}As$, where x decreases from 1 to 0 in a direction away from the contact region 8. As indicated above, the use of such a graded band gap injector region 9 enables an improvement in the power and efficiency of the transferred electron effect device by allowing, in operation of the device, the accumulation or dipole layer to start within the active region 6 as close as possible to the cathode region K.

Generally, the gallium indium arsenide contact regions 5 and 8 have the composition $Ga_{0.47}In_{0.53}As$ so that the contact region 8 provides a lattice match to the graded band gap injector region 9 which will, in this example, have the composition $Ga_{0.47}In_{0.535}As$ adjacent the contact region 8.

In this example, the anode region A comprises the highly doped gallium indium arsenide contact region 5 and a highly doped indium phosphide region 3 separating the contact region 5 from the active region 3.

The electron-containing well region 10a is in this example formed of n conductivity type gallium indium arsenide again with the composition $Ga_{0.47}In_{0.53}As$ so as to provide a lattice match to the adjoining injector and active regions 9 and 6.

Figure 2:
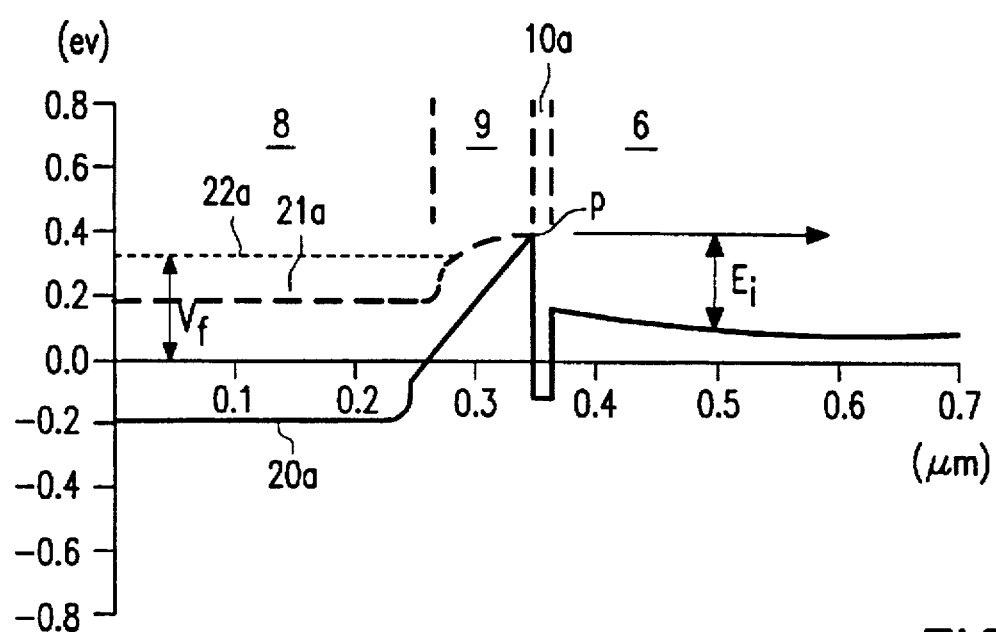
FIG. 2 illustrates graphically conduction band energy levels within a first example of a transferred electron effect device in accordance with the invention having the structure shown in FIG. 1 for the case when no voltage is applied across the transferred electron effect device and for the case where a forward-biasing voltage is applied across the transferred electron effect device.

FIG. 2 illustrates schematically the energy level in electron volts (eV) across the area around the active region 6 of one example of a transferred electron effect device 1a having the structure shown in FIG. 1. The solid line 20a in FIG. 2 illustrates the conduction band energy when no voltages are applied to the cathode and anode electrodes 4 and 7 while the dashed line 21a illustrates the change in the conduction band energy level when a forward-biasing voltage of 30 volts is applied between the cathode and anode electrodes 4 and 7. The dotted line 22a represents the applied forward-biasing voltage Vf. The Fermi level is defined as the zero level in FIG. 2.

As shown in FIG. 2 by the dimensions in micrometers (μm) given on the horizontal axis, in the specific example being illustrated, the cathode contact region 8 has a thickness of 0.25 μm and is doped to a concentration of $5 \times 10^{18}$ atoms $cm^{-3}$ with a suitable n conductivity type dopant, for example silicon atoms.

The graded band gap injector region 9 is 0.1 μm thick and is intrinsic, that is not intentionally doped, having in practice a net n conductivity type dopant concentration of about $10^{16}$ atoms $cm^{-3}$. The active region 6 has a thickness of 1.1 μm and has a doping concentration of about $10^{16}$ atoms $cm^{-3}$, that is it is not intentionally doped.

In the example illustrated by FIG. 2, the well region 10a is 10 nm (nanometers) thick and is doped so as to be of n conductivity type with a dopant concentration of $2 \times 10^{18}$ atoms $cm^{-3}$. The indium phosphide active region 6 and the graded band gap injector region 9 form the barrier regions of the well region.

As indicated above, in order for the active region 6 to exhibit negative differential resistance so that the structure may function as a transferred electron effect device, electrons emitted into the active region must have or acquire sufficient energy to transfer from the relatively low mass, high mobility conduction band main minimum to a relatively high mass, low mobility conduction band satellite minimum within the active region 6.

As shown clearly in FIG. 2, the graded band gap injector region 9 defines a potential barrier P so that only electrons with sufficient energy can pass over the barrier to enter the active region 6. The barrier height provided by the graded band gap injector region 9 and thus the energy at which electrons are emitted over the barrier is determined by the difference between the Fermi level in the active region 6 and the highest point of the barrier P. The sum of the energy $E_i$ at which electrons are emitted over the barrier P and of the energy separation between the conduction band edge and Fermi level of the active region 6 should not exceed the energy difference between the conduction band main minimum and the satellite minima in the active region 6. In the case of indium phosphide, the energy difference between the conduction band main minimum and the satellite minima is 0.53 eV.

In operation of such a transferred electron effect device, when a low bias or voltage is applied across the anode and cathode electrodes 4 and 7, the ramp in the conduction band provided by the graded band gap injector region 9 should, as indicated by the solid line 20a in FIG. 2, form the largest resistance within the structure so that almost all the applied bias will fall across the graded band gap injector region 9. At high applied biases, as shown by the dashed line 21a in FIG. 2, the ramp in the conduction band caused by the graded band gap injector region 9 should have been almost flattened and the extra bias falls across the active region 6. This flattening changes the field within the transferred electron effect device and it is important to ensure that this change in field does not start to deplete part of the active or drift region 9.

The amount of doping required to enable the well region 10a to inhibit the spread of the depletion region into the active region 6 may be estimated. Thus, when no voltage is applied across the anode and cathode electrodes 4 and 7, that is at zero bias, the electric field within the transferred electron effect device resulting from the graded band gap region 9 (that is, the built-in field) is approximately $\Delta E_c / L$ where $\Delta E_c$ is the conduction band offset between the gallium indium arsenide of the well region 10a and the aluminium indium arsenide of the graded band gap injector region 9 (about 0.52 eV) and L is the distance over which the grading (assumed to be linear) is achieved. With L about 100 nm and with the region thicknesses and dopings given above for the example of FIG. 2 (excluding the depletion stop 10, of course), then the built-in field is about $5.2 \times 10^4$ V/cm. This built-in field reduces to approximately zero under full forward applied voltage or bias. The change in field must be supported by a change in the charge distribution and, in a simple depletion model, this could be achieved by moving the depletion edge a distance d through a material doped with N dopant atoms/cm$^3$, where $$\frac{\Delta E_0}{L} = \frac{qNd}{\epsilon_s}$$

The product Nd thus represents the dopant density per unit area required to support the change in electric field. Using the figures given above, this gives $3.4 \times 10^{11}$ cm$^2$. Although in a transferred electron effect device, the mobile charge carriers are confined within a narrow well rather as in a two-dimensional electron gas and so the change in charge is achieved by emptying and filling of the well rather than by movement of the depletion edge, the required additional charge will be the same as that estimated above.

The barrier height provided by the graded band gap injector region 9 and thus the energy at which electrons are emitted over the barrier is determined by the difference between the Fermi level in the active region 6 and the highest point of the barrier. In the example illustrated in FIG. 2, this energy difference estimated to be $E_i$ is 0.36 eV, although it does depend in detail on the sheet electron density in the well region and on the width of the well region 10a. The latter determines the lowest confined energy state while the former determines how far the Fermi level in the well region 10a lies above this lowest confined state. Shifts in the Fermi level directly affect the injection energy. In the example illustrated by FIG. 2, the Fermi level is relatively low in the well region 10a and so the injection energy is high. However, it is clear that about 0.1 μm of the active region 6 has a reduced carrier density (that is the conduction band is further above the Fermi level there than elsewhere in the active region 6).

Figure 3:
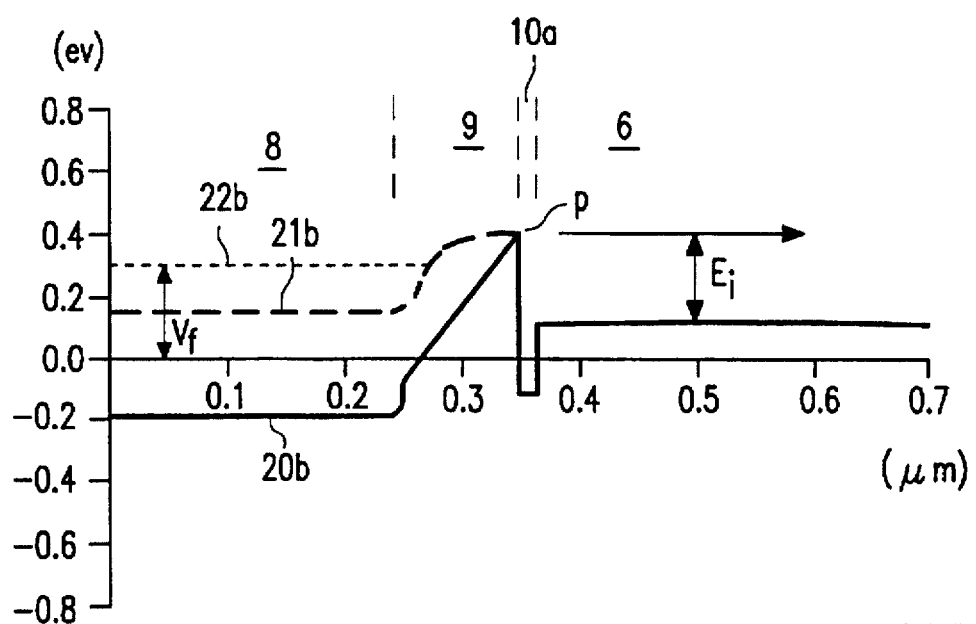
FIG. 3 illustrates graphically conduction band energy levels within a second example of a transferred electron effect device in accordance with the invention having the structure shown in FIG. 1 for the case when no voltage is applied across the transferred electron effect device and for the case where a forward-biasing voltage is applied across the transferred electron effect device.

FIG. 3 illustrates the energy level in electron volts (eV) of the area around the active region 6 of a transferred electron effect device 1b which differs from the transferred electron effect device 1a of FIG. 2 merely by virtue of the fact that the doping within the well region 10a has been increased to $5 \times 10^{18}$ atoms cm$^{-3}$, that is 2.5 times the doping of the well region of the transferred electron effect device of FIG. 2.

The solid 20b, dashed 21b and dotted 22b lines in FIG. 3 correspond to the solid 20a, dashed 21a and dotted 22a lines of FIG. 2. As can be seen from FIG. 3, the Fermi level is now higher in the well region 10a so that there is no depletion of the active region 6; rather it is actually accumulating electrons. However, the energy difference $E_i$ has now dropped to 0.29 eV. This suggests that the optimum doping concentration for the well region 10a is to be found between the doping concentrations of the examples of transferred electron effect devices 1a and 1b shown in FIGS. 2 and 3, that is between $2 \times 10^{18}$ atoms cm$^{-3}$ and $5 \times 10^{18}$ atoms cm$^{-3}$.

Figure 4:
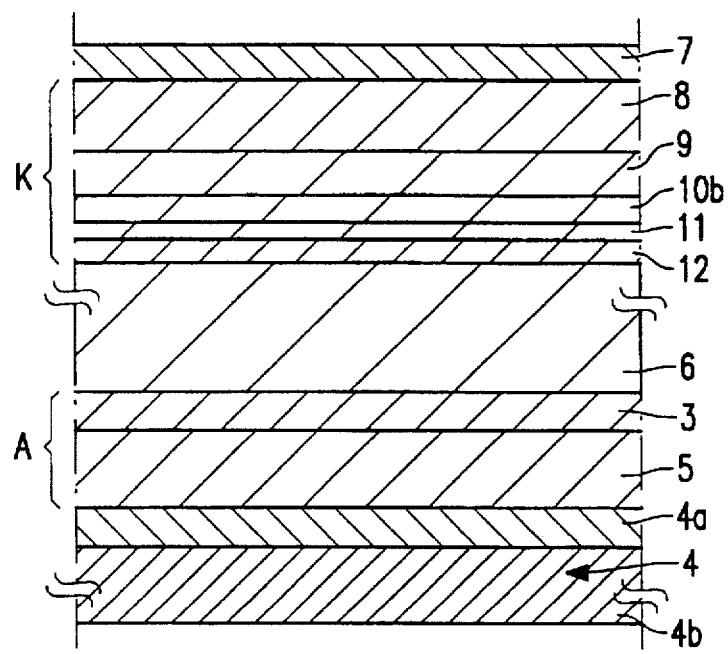
FIG. 4 shows a schematic cross-sectional view through part of a modified version of a transferred electron effect device in accordance with the invention.
Figure 5:
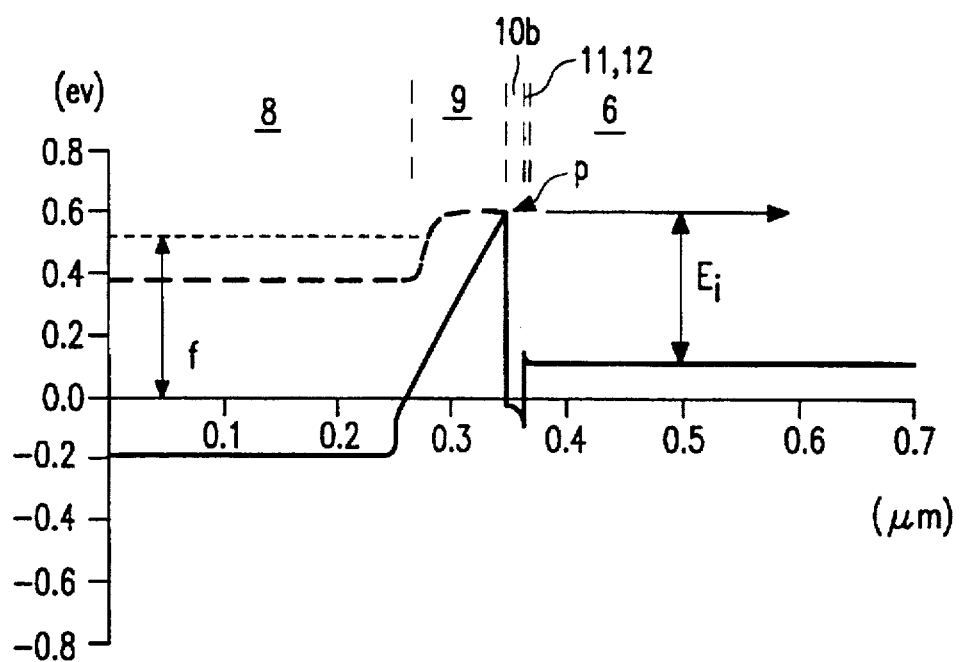
FIG. 5 illustrates graphically conduction band energy levels within one example of a transferred electron effect device having the structure shown in FIG. 4 for the case when no voltage is applied across the transferred electron effect device and for the case where a forward-biasing voltage is applied across the transferred electron effect device.

FIG. 4 shows a cross-section through part of a modified transferred electron effect device 1c while FIG. 5 illustrates the energy level in electron volts (eV) across the transferred electron effect device 1c which differs from the transferred electron effect device 1a of FIG. 2 in that the well region 10b is not directly doped but is doped by modulation-doping. The solid 20c, dashed 21c and dotted 22c lines in FIG. 5 correspond to the solid 20a, dashed 21a and dotted 22a lines of FIG. 2.

As shown most clearly in FIG. 4, the well region 10b is formed of intrinsic gallium indium arsenide with the same composition as given above. The well region 10b is spaced from the active region 6 by a spacer region 11. The spacer region 11 separates the well region from a doped modulation region 12. Both the spacer region 11 and the modulation region 12 are formed of indium phosphide.

The various regions are formed of the same material and have the same dopings and thicknesses as in FIG. 2, but, as indicated above, the well region is not intentionally doped and the indium phosphide spacer and modulation regions 11 and 12 have been added. The spacer and modulation regions 11 and 12 are both, in this example, 2 nm thick and the modulation region 12 is doped with suitable n conductivity impurities to a dopant concentration of $5 \times 10^{18}$ atoms cm$^{-3}$.

As will be appreciated by those skilled in the art, the spacer region 11 could be omitted, if desired.

The use of a modulation doping arrangement enables the dopant to be separated from the well region 10b allowing the width of the well region 10b and the dopant concentration to be determined separately. Although the dopant concentration is the same, the transferred electron effect device 1c illustrated by FIGS. 4 and 5 uses less dopant ($1 \times 10^{12}$ cm$^{-2}$) than the transferred electron effect devices 1a and 1b because the modulation region 12 is thinner than the well region 10a. Thus, as can be seen from FIG. 5, in this design the Fermi level is much lower than in the transferred electron effect devices 1a and 1b, thereby improving the injection energy $E_i$ to as high as 0.44 eV. This makes it even more likely that electrons emitted over the barrier provided by the graded band gap injector will be transferred directly to a satellite conduction band minimum and so should provide an even better output power and efficiency than the example shown in FIG. 2.

Moreover, because the dopant is located in the modulation region 12, the fact that the Fermi level is low in the well region 10b does not necessarily lead to depletion of the active region 6. FIG. 5 does show a slight reduction in carrier density in the drift region 6 under the strong forward bias shown by line 21d, but reduction could be avoided by an appropriate increase in the dopant concentration within the modulation region 12 without affecting the position of the Fermi level in the well region 10b.

Figure 6:
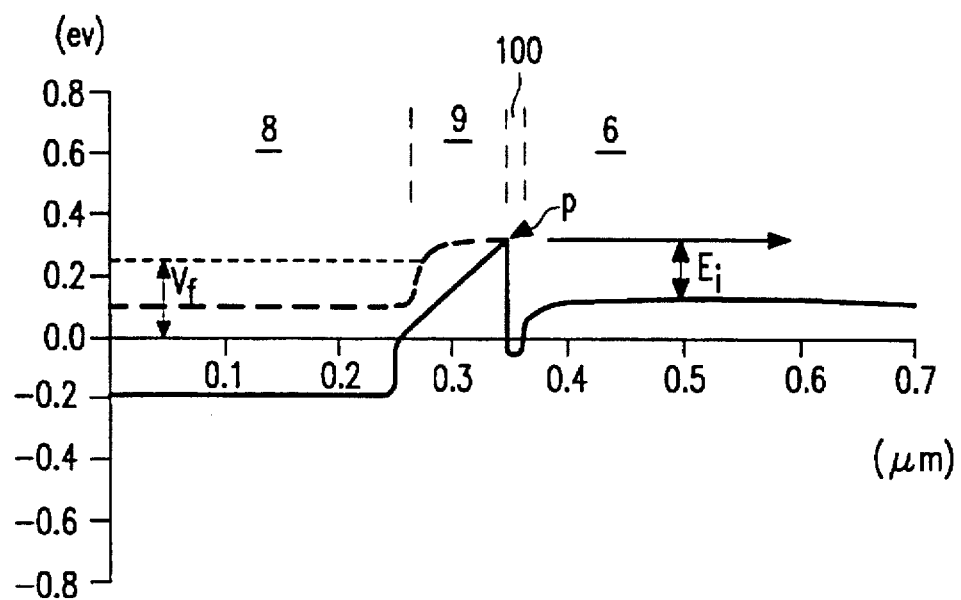
FIG. 6 illustrates graphically conduction band energy levels within a transferred electron effect device without a well region for the case when no voltage is applied across the transferred electron effect device and for the case where a forward-biasing voltage is applied across the transferred electron effect device.

In order to illustrate the effect of incorporating a well region 10a or 10b into a transferred electron effect device, FIG. 6 illustrates schematically the energy level in electron volts (eV) across the area around the active region 6 of a transferred electron effect device 1d having the structure shown in FIG. 1 and the same thicknesses and dopant concentrations as in the example described above with reference to FIG. 2 but without the well region 10a.

In this case, the well region 10a is replaced by a highly doped depletion stop region 100 of the same material as the active region 6, indium phosphide in these examples. The depletion stop 100 should, of course, be sufficiently thin to allow the passage of hot charge carriers, that is charge carriers with an energy above the Fermi level of the active region 6, to pass without significant cooling or thermalisation. For the purposes of direct comparison, the depletion stop 100 has the same thickness, 10 nm, as the well region 10a, 10b and has a dopant concentration of $2 \times 10^{18}$ cm$^{-3}$.

Again, the solid line 20d in FIG. 6 illustrates the conduction band energy when no voltages are applied to the cathode and anode electrodes 4 and 7 while the dashed line 21d illustrates the change in the conduction band energy level when a forward-biasing voltage of 30 volts is applied between the cathode and anode electrodes 4 and 7. The dotted line 22d represents the applied forward-biasing voltage Vf. The Fermi level is again defined as the zero level in FIG. 6.

In the example illustrated in FIG. 6, the energy difference $E_i$ is merely 0.17 eV because the indium phosphide depletion stop 10 acts to drag down the Fermi level adjacent the barrier.

Accordingly, the transferred electron effect device 1a structure illustrated by FIG. 6 probably would not allow electrons to be injected into the active region with sufficient energy to transfer directly to a satellite minimum and a significant proportion of the active region would be taken up in operation of the device 1d by the acceleration or dead zone required for electrons to gain sufficient energy to transfer to a conduction band satellite minimum. Thus, the device 1d will have a lower output power and efficiency than any of the devices 1a to 1c described above.

In contrast to the example of FIG. 6, the examples in accordance with the invention described above with reference to FIGS. 2 to 5 provide an energy difference $E_i$ that is much greater than that provided by the example shown in FIG. 6. Indeed, an energy difference $E_i$ over twice the energy difference $E_i$ for the example of the transferred electron effect device 1d illustrated by FIG. 6 is achieved by the example of a transferred electron effect device 1a shown in FIG. 2 while an even energy difference is attained by the device 1c illustrated by FIGS. 4 and 5. In each case, the improved energy difference is achieved because, as can be seen by comparing FIGS. 2, 3 and 5 with FIG. 6, the band bending which arises when the indium phosphide depletion stop 10 is used in the example shown in FIG. 6 is avoided when a well region 10a, 10b in accordance with the invention is provided.

The present inventor has thus found that replacing the indium phosphide depletion stop region 10 with a well region 10a or 10b causes a significant increase in the energy difference $E_i$ and enables electrons to be emitted over the barrier P provided by the graded band gap region 9 with an energy comparable to that of a conduction band satellite minimum, which electrons can thus transfer directly to a conduction band satellite minimum, without the need for any acceleration or dead zone, to enable the transferred electron effect device 1b to exhibit negative differential resistance. Accordingly, a device in accordance with the invention can exhibit higher rf output powers and greater efficiencies than a device such as that shown in FIG. 6.

FIGS. 7 to 10 illustrate one way of manufacturing a transferred electron effect device in accordance with the invention.

Figure 7:
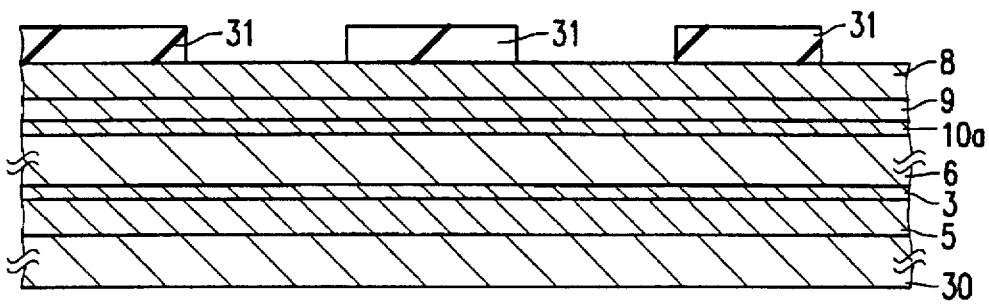
FIGS. 7 to 10 illustrate schematically a method of manufacturing a transferred electron effect device in accordance with the invention.

As illustrated by FIG. 7, the various semiconductor regions forming the device, as shown the device 1a of FIGS. 1 and 2, are epitaxially deposited onto a suitable monocrystalline semiconductor substrate 30 by any suitable technique such as molecular beam epitaxy (MBE) or metal organic vapour phase epitaxy (MOVPE) so that the anode contact region 5 is adjacent the substrate. Discrete transferred electron effect devices 1a are then defined by providing a photosensitive resist mask 31 on the exposed surface of the cathode contact region 8 and etching the regions using a suitable etching process to define the devices 1a as discrete mesas. The indium gallium arsenide anode contact region 5 is used as an etch stop layer so that the etching terminates at the substrate 30.

Figure 8:
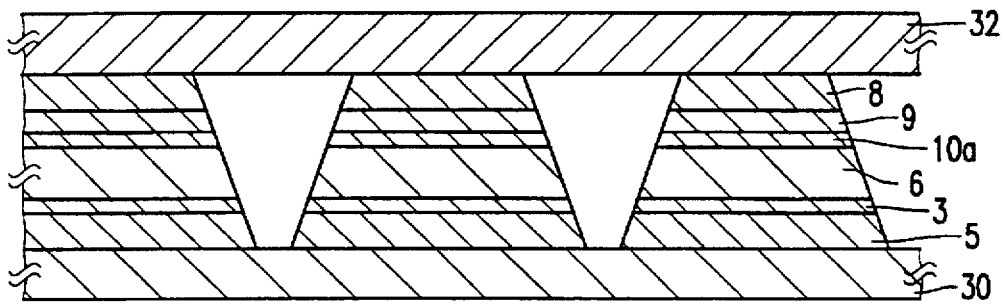

A sacrificial support layer 32 of a suitable material is then provided on cathode contact regions 8 as shown in FIG. 8. The support layer 32 may be formed by plating a metal such as silver normally used for heat sinks.

Figure 9:
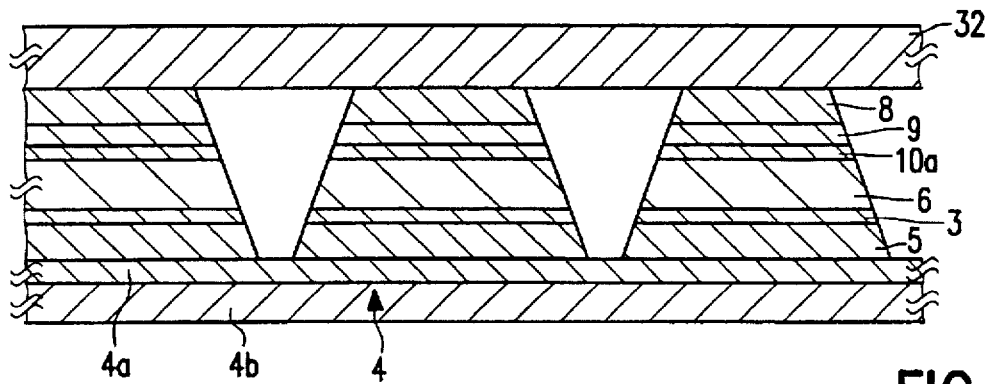

The substrate 30 is then selectively removed by a suitable etching process and a suitable metal deposited onto the exposed surfaces of the anode contact regions to form the anode electrode and heat sink. As indicated in FIG. 9 and in FIGS. 1 and 5, the anode electrode 4 may comprise two subsidiary layers one of which 4a functions to provide the ohmic contract to the anode contact region 9 and the other 4b of which functions primarily as a heat sink. Again the heat sink may be formed of silver.

Figure 10:
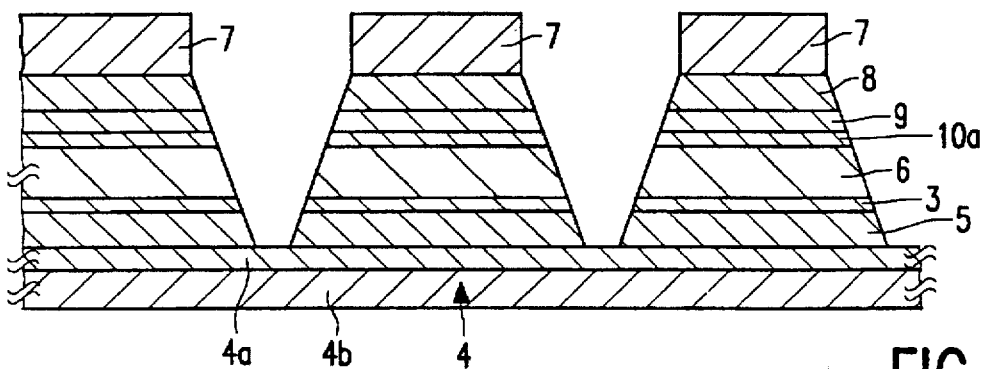

The sacrificial support layer 32 is then removed and metal deposited to form the cathode electrodes 7 as shown in FIG. 10.

This method is advantageous in that the active region 6 is grown before the injector region 9 so that the injector region 9 is not subjected to the prolonged high temperature processing required to form the active region 6. Also, as indicated in our U.S. Pat. No. 5,250,815, the provision of the heat sink at the anode rather than the cathode of a transferred electron effect device having an injector region results in surprising improvements in, especially, rf output power.

Although the above examples describe transferred electron effect devices in which the active region is formed of indium phosphide, the present invention could be applied where other materials are used, for example where the active region is formed of gallium arsenide or of materials containing indium phosphide or gallium arsenide. Of course, as would be appreciated by those skilled in the art, appropriate changes would have to be made to the other III–V materials used to form the device.

The present invention may also be applied to devices with different types of injector regions, for example injector regions of the type described and claimed in our U.S. Pat. No. 5,258,624.

Although the formation of ohmic contacts to transferred electron effect devices having active regions formed of gallium arsenide is relatively simple, it has previously been extremely difficult to form ohmic contacts to transferred electron effect devices having active regions formed of indium phosphide or indeed to indium phosphide regions in other devices. Currently a heat treatment is generally used to diffuse dopants out of the electrode metal into the indium phosphide to enable a reasonable ohmic contract to be formed but such a process can be very difficult to control. The present inventor has, however, found a way of forming an ohmic contact to indium phosphide without resorting to such out-diffusion treatments.

Thus, the provision of the highly doped gallium indium arsenide anode and cathode contact regions 5 and 8 allows the anode and cathode electrodes 4 and 7 to make good ohmic contact to the transferred electron effect device structure without having to resort to the out-diffusion of dopants from the electrodes 4 and 7. Generally, the highly doped gallium indium arsenide anode and cathode contact regions 5 and 8 will be lattice-matched to the adjoining regions and in the examples described above have the composition $Ga_{0.47}In_{0.53}As$ so as to provide a lattice match between the contact region 8 and the graded band gap injector region 9. Of course, highly doped gallium indium arsenide contact regions may be used anywhere it is desired to form an ohmic contact to an indium phosphide region or device.

From reading the present disclosure, other modifications and variations will be apparent to persons skilled in the art. Such modifications and variations may involve other features which are already known in the art and which may be used instead of or in addition to features already described herein. Although claims have been formulated in this application to particular combinations of features, it should be understood that the scope of the disclosure of the present application also includes any novel feature or combination of features disclosed herein either explicitly or implicitly, whether or not relating to the same invention as presently claimed in any claim and whether or not it mitigates any or all of the same technical problems as does the presently claimed invention. The applicants hereby give notice that new claims may be formulated to such features and/or combinations of such features during prosecution of the present application or of any further application derived therefrom.

I claim:

1. A transferred electron effect device comprising a semiconductor body having an active region of n conductivity type formed of a material having a relatively low mass, high mobility conduction band main minimum and at least one relatively high mass, low mobility conduction band satellite minimum and an injector region defining a potential barrier to the flow of electrons into the active region of a height such that, in operation of the device, electrons with sufficient energy to surmount the barrier provided by the injector region are emitted into the active region with an energy comparable to that of the at least one relatively high mass, low mobility conduction band satellite minimum, characterised in that an electron-containing well region of a material different from that of the active region and of the injector region is provided between the injector region and the active region for inhibiting the spread of a depletion region into the active region during operation of the device.

2. A transferred electron effect device according to claim 1, wherein the injector region comprises a graded band gap injector region.

3. A transferred electron effect device according to claim 2, wherein the active region comprises indium phosphide and the graded band gap injector region comprises gallium aluminium indium phosphide.

4. A transferred electron effect device according to claim 3, wherein the graded band gap injector region comprises $GA_{0.48x}Al_{0.48(1-x)}In_{0.52}As$, where x decreases from 1 to 0 towards the active region.

5. A transferred electron effect device according to claim 3, wherein the well region comprises n conductivity type gallium indium arsenide.

6. A transferred electron effect device according to claim 1, wherein the well region is not intentionally doped and a relatively highly doped semiconductor modulation region doped so as to be n conductivity type and spaces the well region from the active region.

7. A transferred electron effect device according to claim 6, wherein the modulation region is spaced from the well region by an intrinsic spacer region formed of the same semiconductor as the modulation region.

8. A transferred electron effect device according to claim 6 or 7, wherein the well region comprises gallium indium arsenide and the modulation region comprises indium phosphide.

9. A transferred electron effect device according to claim 1, wherein a heat sink region is provided on the exposed surface of the anode region for removing heat dissipated in the device.

10. A transferred electron effect device comprising a semiconductor body having an active region comprising indium phosphide doped so as to be n conductivity type, anode and cathode semiconductor regions spaced apart by the active region and each comprising semiconductor regions highly doped so as to be n conductivity type and anode and cathode electrodes contacting the anode and cathode regions, respectively, characterised in that the anode and cathode regions comprise highly n conductivity type gallium indium arsenide regions forming ohmic contacts with the anode and cathode electrodes, respectively.

11. A transferred electron effect device according to claim 10, wherein the cathode region is spaced from the active region by a graded band gap injector region.

12. A transferred electron effect device according to claim 11, wherein the graded band gap injector region comprises gallium aluminium indium phosphide.

13. A transferred electron effect device according to claim 12, wherein the graded band gap injector region comprises $Ga_{0.48x}Al_{0.48(1-x)}In_{0.52}As$, where x decreases from 1 to 0 in a direction away from the cathode region.

14. A transferred electron effect device according to claim 11, wherein the graded band gap injector region is spaced from the active region by a well region which is doped so as to be n conductivity type.

15. A transferred electron effect device according to claim 14, wherein the well region comprises gallium indium arsenide.

16. A transferred electron effect device according to claim 11, wherein the graded band gap injector region is spaced from the active region by a well region which is modulation-doped by a relatively highly doped semiconductor modulation region doped so as to be n conductivity type and spacing the well region from the active region.

17. A transferred electron effect device according to claim 16, wherein the modulation region is spaced from the well region by an intrinsic spacer region formed of the same semiconductor as the modulation region.

18. A transferred electron effect device according to claim 16, wherein the well region comprises gallium indium arsenide and the modulation region comprises indium phosphide.

19. A transferred electron effect device according to claim 10, wherein a heat sink region is provided on the exposed surface of the anode region for removing heat dissipated in the device.

* * * * *